United States Patent
Onishi et al.

(10) Patent No.: US 8,273,644 B2
(45) Date of Patent: Sep. 25, 2012

(54) SOLDERING METHOD AND METHOD OF MANUFACTURING SEMICONDUCTOR DEVICE INCLUDING SOLDERING METHOD

(75) Inventors: Kazunaga Onishi, Matsumoto (JP); Yoshitaka Nishimura, Azumino (JP); Tatsuo Nishizawa, Matsumoto (JP); Eiji Mochizuki, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 12/037,721

(22) Filed: Feb. 26, 2008

(65) Prior Publication Data

US 2008/0206928 A1 Aug. 28, 2008

(30) Foreign Application Priority Data

Feb. 26, 2007 (JP) ................. 2007-045339

(51) Int. Cl.
 *H01L 21/3205* (2006.01)
 *H01L 21/4763* (2006.01)
(52) U.S. Cl. . 438/585; 438/125; 438/487; 257/E21.505; 257/E21.134; 257/E21.318
(58) Field of Classification Search ............. 438/585, 438/125, 487; 257/E21.505, E21.134, E21.318
See application file for complete search history.

(56) References Cited

U.S. PATENT DOCUMENTS

| | | | | |
|---|---|---|---|---|
| 5,281,772 A | * | 1/1994 | Myers et al. | 174/267 |
| 5,334,422 A | * | 8/1994 | Myers et al. | 427/552 |
| 6,278,078 B1 | * | 8/2001 | Walvoord et al. | 219/121.61 |
| 7,037,811 B1 | * | 5/2006 | Yamazaki et al. | 438/487 |
| 2005/0263767 A1 | * | 12/2005 | Yamazaki et al. | 257/72 |
| 2006/0204177 A1 | * | 9/2006 | Singh et al. | 385/52 |

FOREIGN PATENT DOCUMENTS

| | | | |
|---|---|---|---|
| JP | 62-76588 | A | 4/1987 |
| JP | 02-030374 | A | 1/1990 |
| JP | 02-122594 | A | 5/1990 |
| JP | 08-031848 | A | 2/1996 |
| JP | 08031848 | A * | 2/1996 |
| JP | 2000-311905 | A | 11/2000 |
| JP | 2004-047848 | A | 2/2004 |

OTHER PUBLICATIONS

Japanese Office Action issued in co-pending application 2007-045339, dispatched date of Jul. 12, 2011. Partial translation of "Notification of Reasons for Refusal" provided herewith.
Office Action issued Aug. 18, 2011 for corresponding Chinese Patent Application No. 200810082231.6.
Notification of Second Office Action for corresponding CN 200810082231.6, mailing date Jan. 11, 2012. No new references cited. English translation provided.

* cited by examiner

*Primary Examiner* — Charles Garber
*Assistant Examiner* — Abdulfattah Mustapha
(74) *Attorney, Agent, or Firm* — Rossi, Kimms & McDowell LLP (57) ABSTRACT

A soldering method of soldering first and second members includes shooting a laser light to at least one part of an outer peripheral portion surrounding a soldering-target region of the first member thereby to form an oxide film, and bonding the second member with the soldering-target region through a solder. According to the method, the solder resist is never exfoliated even after cleaning with chemicals for removing flux residues contained in solder.

21 Claims, 8 Drawing Sheets

SOLDERING METHOD AND METHOD OF MANUFACTURING SEMICONDUCTOR DEVICE INCLUDING SOLDERING METHOD

BACKGROUND

The present invention relates to a method of soldering two members to each other, and more specifically a method of soldering two members to each other so that solder used for bonding does not run over a given region. Also, it relates to a method of manufacturing a semiconductor device by soldering.

Soldering has been generally adopted as a method of mounting a component on a circuit pattern on an insulating board. Also, soldering has been adopted as a method of bonding an insulating board to a cooling plate. Soldering is performed by applying a solder paste to opposing faces of two members to be bonded to each other or putting a solder sheet between the faces and then melting the solder paste or sheet.

For such process, a method of using a solder resist film has been known as a method of bonding two members in position, which is disclosed in, e.g., JP-A-2004-47848. The solder resist is a resin composition. A solder resist film is formed in a given pattern on the surface of one of two members to be bonded. As a portion on which the solder resist film lies is never wetted with solder, melted solder can be made to stay on a given soldering region on which no solder resist is formed, and therefore it is possible to prevent the solder from adhering to a region other than the soldering region.

Figure 7A:
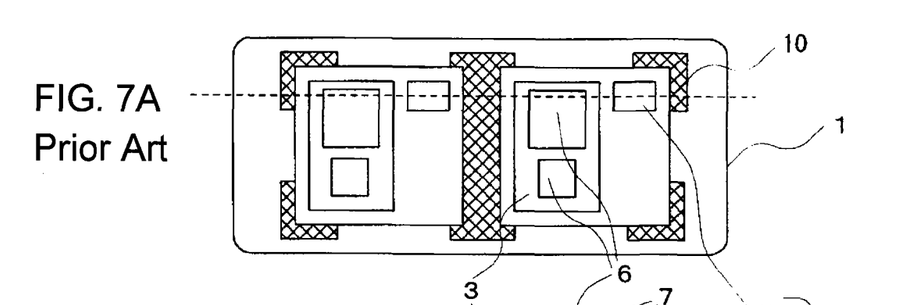
FIGS. 7A and 7B are illustrations showing an important portion of a semiconductor device manufactured using a solder resist.
Figure 7B:
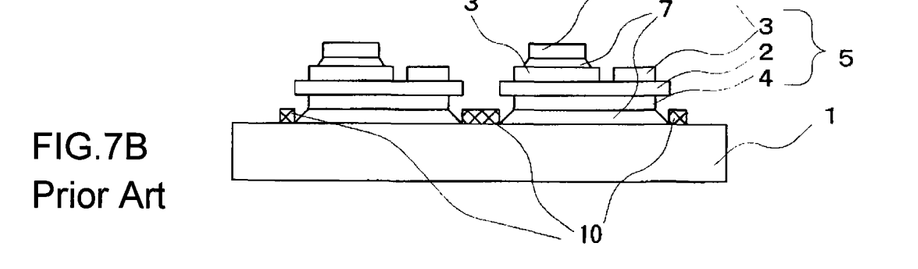

FIGS. 7A and 7B are illustrations showing an important portion of a semiconductor device manufactured using a solder resist. Of the drawings, FIG. 7A is a top view, and FIG. 7B is a sectional view of the important portion taken along the broken line shown in FIG. 7A. In the drawings, the reference numeral 1 denotes a cooling base plate made of copper; the numeral 2 denotes a ceramic plate; the numeral 3 denotes a copper pattern formed on a front face of the ceramic plate; and the numeral 4 denotes a copper pattern formed on a rear face of the ceramic plate. The ceramic plate 2 and copper patterns 3 and 4 constitute an insulating board 5. The numeral 6 denotes a semiconductor element, such as an IGBT (Insulated Gate Bipolar Transistor), and a FWD (Free Wheeling Diode). The cooling base plate 1 and the copper pattern 4 on the rear face of the insulating board 5 are bonded by solder 7. Also, the copper pattern 3 on the front face of the insulating board 5 and the semiconductor element 6 are bonded by the solder 7.

To prevent the solder 7 from running over a given soldering region during soldering, a solder resist film 10 is formed on an outer peripheral portion surrounding the soldering region on the surface of the cooling base 1. The solder resist film 10 does not surround the outer periphery of the insulating board 5 completely as in FIG. 7A. This is because the insulating board 5 can be prevented from being displaced as the solder 7 is melted and positioned in place as long as each corner portion of the insulating board 5 is surrounded by the solder resist film 10. Further, a portion between two insulating boards 5 is covered with the solder resist film 10. The reason for this is because adhesion of solder to this portion deteriorates the withstand voltage between the insulating boards 5, and therefore a measure to prevent deterioration in the withstand voltage is taken.

Figure 8A:
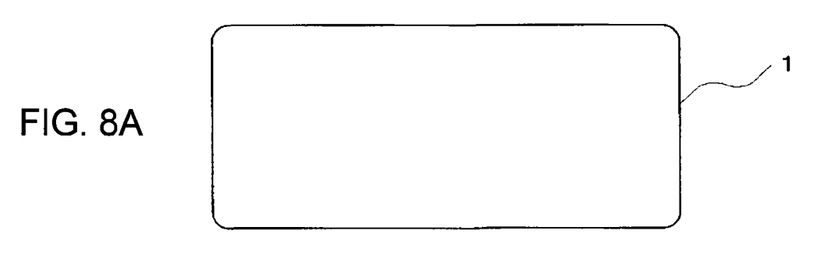
FIGS. 8A to 8C are illustrations that help explain the process of forming a solder resist film 10 on the cooling base plate 1.
Figure 8B:
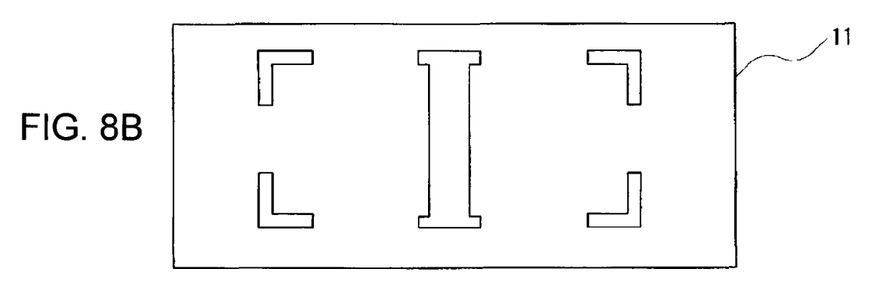
Figure 8C:
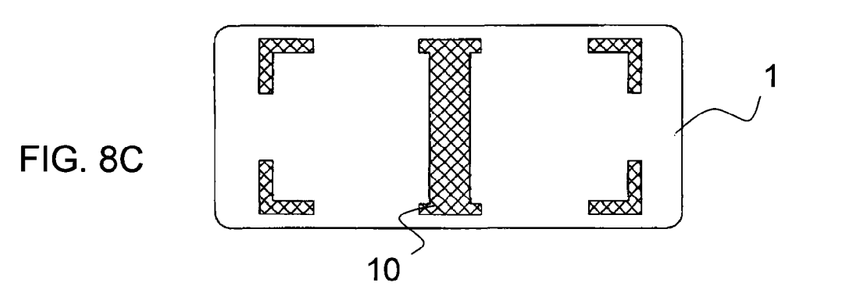

FIGS. 8A-8C are illustrations that help explain the process of forming the solder resist film 10 on the cooling base plate 1. Of the drawings, FIG. 8A shows the cooling base plate 1 prior to formation of the solder resist film 10. FIG. 8B shows a mask 11 for screen-printing the solder resist film in a given pattern on the cooling base plate 1. FIG. 8C shows the cooling base plate 1 with the solder resist film 10 formed thereon.

Now, the process of forming the solder resist film 10 will be described. First, the cooling base plate 1 without the solder resist film 10 is aligned with a stage (not shown), and then put on the stage. Second, the mask as shown in FIG. 8B is put on the cooling base plate 1 after the alignment thereof. Then, some solder resist (i.e. resin ink, not shown) is dropped on the mask 11. The solder resist is printed on a surface of the cooling base plate 1 through fine holes formed in the mask 11 according to a given pattern.

Thereafter the mask 11 is removed and the solder resist is dried and hardened. The resin ink of the solder resist is made of a resin which can be hardened by heating or ultraviolet radiation, and therefore a step to harden the solder resist by heating or ultraviolet radiation is needed after application of the ink onto the cooling base plate 1. The time required between the application of the solder resist and hardening thereof is a few hours. An example of the method as described above is disclosed in JP-A-2004-47848.

The conventional solder resist film as described above is a resin composition. The assembly processes for semiconductor devices include a heating process in soldering, and a chemical cleaning process for removing the residue of flux contained in solder. A solder resist film having a resin composition has had a problem in that the solder resist film is exfoliated in the process of manufacturing semiconductor devices because of the influences of a thermal hysteresis in the heating process and chemicals used for washing. Also, it takes much time to prepare a cooling base plate with a solder resist film 10 formed thereon because the steps for drying and hardening the solder resist are required after application of the solder resist (resin ink).

Further, to print a solder resist by means of screen-printing, masks 11 corresponding in number to types of patterns of the solder resist film 10 are required. It is difficult to form a fine pattern by use of the mask 11. Moreover, even an insignificant change in design of a semiconductor device will lead to the change in the pattern of the solder resist film and increase the types of patterns. Also, it is necessary to form a mask 11 each time the pattern is changed or increased in number, which becomes a factor to raise the manufacturing cost.

Further, a mask for screen-printing has a fine through-hole through which a solder resist (resin ink) flows, and therefore if the mask is left as it is after screen-printing, the solder resist will solidify in the through-hole, and block up the through-hole. Hence, maintenance is required to use the mask 11 repeatedly, such as cleaning the mask with an organic solvent each time the step of printing is completed.

In view of the above, the invention aims to solve the problems involved with a conventional solder resist film having a resin composition.

SUMMARY OF THE INVENTION

A soldering method of soldering first and second members according to the invention includes shooting a laser light to at least one part of an outer peripheral portion surrounding a soldering-target region of the first member thereby to form an oxide film, and bonding the second member with the soldering-target region through a solder. The oxide film may be formed by shooting a pulsed laser light to the first member.

The first oxide film may be formed by changing the energy of the laser light and strongly oxidizing the first member. The second oxide film may be formed by changing the energy and weakly oxidizing the first member. The first oxide film may be formed adjacent to the soldering region.

The oxide film may be formed in a line-shaped form and/or a dot-like form by shooting the pulsed laser light to the first member while moving a shooting point of the pulsed laser light.

Further, the oxide film in the line-shaped form and/or dot-like form is formed on at least two locations at intervals which prevent a drop of solder having flowed over on to the first member from the soldering-target region in the step of bonding the second member from flowing out to an outside of the soldering-target region.

Also, in the soldering method, the step of bonding the second member is executed in an atmosphere having no reducing property.

In a further preferred embodiment of the invention, a method of manufacturing a semiconductor device includes shooting a laser light to at least one part of the outer peripheral portion surrounding the soldering-target region on a surface of a cooling base to which an insulating board is soldered thereby to form an oxide film, and soldering the insulating board to the soldering-target region. The oxide film may be formed so as to cover a corner portion of the insulating board, or may be formed so as to partially cover a side of the insulating board. When at least two insulating boards identical with the insulating board are arranged, the oxide film may be formed so as to cover opposing sides of the insulating boards.

According to the invention, the resist can prevent solder from flowing out in the soldering step, and is never exfoliated even after a thermal treatment or a chemical treatment. In addition, the number of steps and the cost required for forming the resist can be reduced.

BRIEF DESCRIPTION OF THE DRAWINGS

The invention will be described with reference to certain preferred embodiments and the accompanying drawings, wherein.

DETAILED DESCRIPTION OF THE PREFERRED EMBODIMENTS

Figure 1:
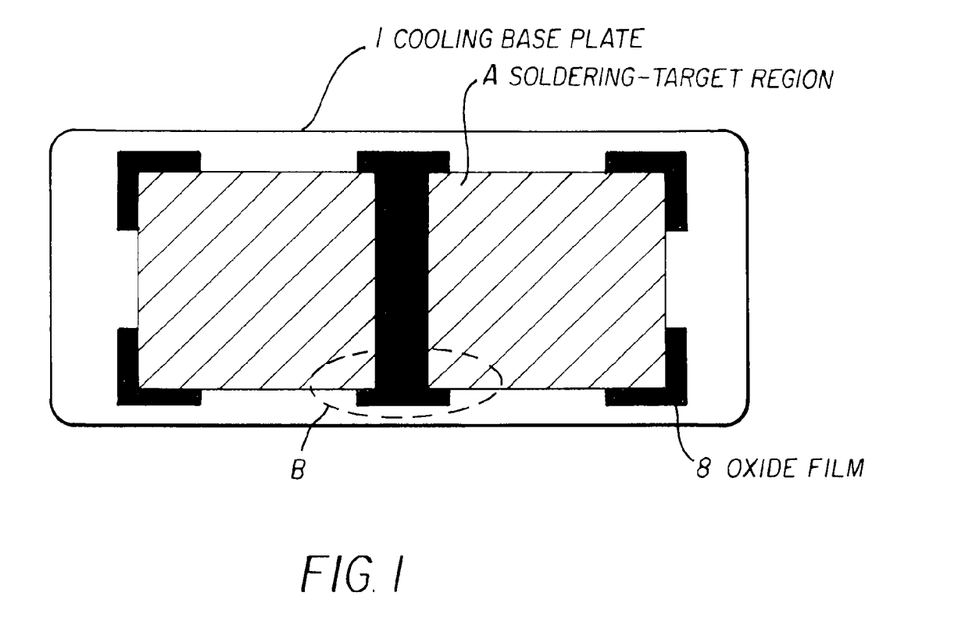
FIG. 1 is an illustration showing a cooling base plate according to the first embodiment.

FIG. 1 is an illustration showing a cooling base plate according to the first embodiment of the invention. In the drawing, the reference numeral 1 denotes the cooling base plate as a first member. It is desirable that the cooling base plate is of a material superior in thermal conductivity because it is used to dissipate the heat of a semiconductor device. Therefore, it is common to use a metal plate intended for heat dissipation, e.g. a copper plate, an aluminum plate, and a copper-molybdenum composite material for the cooling base plate. However, it is necessary to form an oxide film on a surface of the cooling base plate as stated below, and therefore a material which allows the cooling base plate to form an oxide film by itself is selected. Hence, a copper plate is herein adopted, which is plated with nickel because of the wettability with respect to solder and the aim of preventing the natural oxidation of a surface thereof.

The reference numeral 8 denotes an oxide film formed on a surface of the cooling base plate 1, which is used as a resist. To differentiate the resist from a solder resist having a resin composition, the resist film is hereinafter referred to as "oxide film" simply. The oxide film 8 is formed by shooting laser light to the cooling base plate, and thermally oxidizing a surface of a copper plate which is the base material of the cooling base plate. The surface of the cooling base plate 1 is plated with nickel as described above. As nickel has a high absorption efficiency with respect to f laser light, it is easily oxidized and melted by irradiation with laser light. When the intensity of energy of the laser light is increased to melt a nickel plating on the surface of the cooling base plate, copper of the cooling base plate 1 is exposed. Subsequently, the copper surface thus exposed is further irradiated with laser light, and the thermal energy resulting from the laser light irradiation oxidizes the surface, whereby an oxide film 8 is formed. Now, it is noted that the intensity of the energy of laser light may be weakened to oxidize only surface nickel.

The oxide film 8 of the cooling base plate 1 is formed on a part of an outer peripheral portion of a region on which to solder the insulating board 5 (which is referred to as a soldering-target region A) as shown in FIG. 1. The insulating board 5 is a second member, which is to be described later. The surface of the oxide film 8 is less prone to be wetted in comparison to nickel on the surface of the soldering-target region. Therefore, even when the solder 7 runs over a given soldering region in the soldering step, if the oxide film 8 is located there, the area wetted by the solder never extends further. In this case, the solder which has run over is returned to the soldering-target region by the surface tension of the melted solder, or remains in the form of a solder drop on the oxide film.

The solder is completely repelled by a solder resist having a resin composition. Therefore, the solder which has extended to the outside of the soldering-target region would run over the solder resist having a resin composition to adhere to, e.g., a region on which a resin housing or the like is stuck in another step. In this respect, there is a problem that it is difficult to remove a solder which has adhered to a region used in another step and hardened as stated above.

The solder which has remained on the oxide film 8 hardens there. On this occasion, when the height of the hardened solder is lower than that of the ceramic plate 2 of the insulating board 5, there is no problem in the withstand voltage. The oxide film 8 has a slight wettability with respect to solder, which can be controlled by means of the degree of its oxidation. Specifically, when stronger oxidation is achieved, the oxide film formed on the cooling base plate becomes thicker. In this case, the energy of the laser light launched to the cooling base plate in order to form a thicker oxide film is made higher. As a result, the surface of the cooling base is roughened, which increases the surface area thereof and therefore makes the area wetted by the solder less prone to widen. In contrast, weaker oxidation decreases the energy of the laser light launched to the cooling base plate. As a result, the surface of the cooling base is not roughened so much. On this account, as to the resultant oxide film, the area wetted by the solder can widen more easily in comparison to the oxide film oxidized strongly. A portion with an oxide film formed thereon has a larger surface area because the surface thereof is roughened in oxidization. Therefore, as the distance to which the area wetted by the solder extends is made larger, the solder can be made to stay on the oxide film.

As in FIG. 1, the oxide film 8 does not completely surround the outer periphery of the soldering-target region A. This is because the second member (i.e. the insulating board 5 to be described later) can be prevented from being displaced as the solder is melted, and positioned in place, as long as a corner portion of the second member (insulating board 5 described below) to be bonded to the soldering-target region A is surrounded by the oxide film 8. In addition, the smaller the area where the oxide film is formed, the shorter the irradiation time of laser light, and the mass productivity of semiconductor devices is improved. Further, the reason why a portion between two soldering-target regions is set as a region on which to form an oxide film is that adhesion of solder to this portion deteriorates the withstand voltage between the first member (cooling base plate 1) and the second member (insulating board 5) bonded on the first member, and therefore it is necessary to prevent the reduction in the withstand voltage.

As for the rest, the oxide film 8 may be formed so as to partially cover a portion corresponding to a side of the second member, in the outer periphery of the soldering-target region A. Also, the second member can be positioned in place by partially covering the respective portions corresponding to sides of the second member with the oxide film 8. Now, in the case of partially forming the oxide film on a portion corresponding to each side of the second member, the oxide film may be formed on a location toward which the melted solder tends to flow in consideration of conditions including the layout of solder 7 before melting.

The thickness of the oxide film formed on the copper surface can be controlled by the irradiation energy of laser light. The intensity of the irradiation energy can be controlled by the parameters, i.e. the output, oscillation frequency, and irradiation time of laser light. For instance, in the case where the irradiation time of laser light is set as a parameter, the first member is oxidized more strongly for a longer irradiation time, and therefore the thicker oxide film is formed. Also, the thickness of the oxide film 8 can be controlled by changing the output of laser light. To form the oxide film 8 on two or more locations with the degree of oxidization varied, more control can be achieved by adjusting the irradiation time in the condition where the output of laser light is kept substantially constant. In addition, if the output of laser light is made as high as possible, the time required to form an oxide film with a desired thickness can be shortened, and therefore it is possible to form oxide films over a wide range for a short time.

The laser light preferably takes a pulse form. Therefore, a desired pattern of the oxide film can be drawn by moving a spot targeted for irradiation with laser light. When the moving speed of the spot targeted for irradiation with laser light is slowed down, the pulsed laser light is launched to the surface of the cooling base plate 1 successively and thus the oxide film 8 is formed in a line shape. For instance, in the case of the output frequency of laser light ranging from 20 kHz to 30 kHz, if the moving speed is assumed to be 50 mm/s, a line-shaped segment of the oxide film 8 can be formed.

When the moving speed of a spot targeted for irradiation with laser light is slowed down in this way, the thickness of the oxide film 8 of the cooling base plate is increased as stated above. In contrast, when the moving speed of a spot targeted for irradiation with laser light is increased, the pulsed laser light is launched to the surface of the cooling plate 1 intermittently, and thus the oxide film 8 is formed in a series of dot-like forms. For instance, in the case of the output frequency of laser light ranging from 20 kHz to 30 kHz, if the moving speed is assumed to be 1000 mm/s, the oxide film 8 can be formed in a successively dot-like form (e.g. having a diameter of about 50 μm).

When the moving speed is further increased (e.g. to 2000 mm/s), the intervals of dot-like segments of the oxide film 8 are widened, and thus intermittent oxide films can be formed. The diameter of the dot of the oxide film can be changed by shifting the location of a focus point of the optical system of the laser light. For instance, in the case of dot-like oxide film segments having a diameter of 50 μm, dot-like oxide film segments can be arranged in zigzag with their centers staggered by 50 μm, as long as the location for starting laser light irradiation is shifted by 50 μm from the location for starting irradiation for the first row along the traveling direction of the light.

FIGS. 2A to 2H are illustrations of patterns of the oxide film formed on the cooling base plate 1 using laser light, and schematically show a portion surrounded by a broken line and denoted by the reference character B in FIG. 1. Specifically, in FIG. 2A, straight line patterns of the oxide film 8 are drawn, and the resultant straight line-shaped segments of the oxide film 8 are tightly arrayed to thereby increase the area of the oxide film.

Figure 2A:
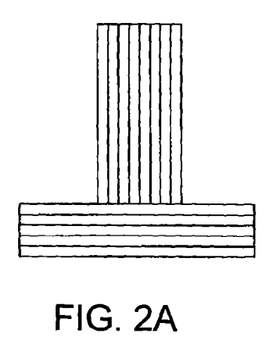
FIGS. 2A to 2H are illustrations showing patterns of the oxide film formed on the cooling base plate 1 using laser light.
Figure 2B:
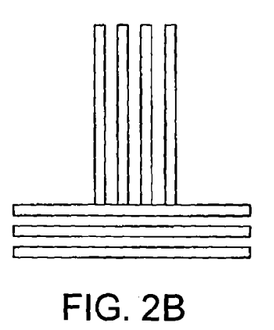

In this case, even when the straight line-shaped oxide film segments are coincident in form with one another, one oxide film segment in contact with the soldering-target region may be strongly oxidized, and others may be weakly oxidized. Even when solder has run over the soldering-target region, the solder is repelled by the strongly oxidized oxide film and returned to the soldering-target region by the action of the surface tension of the melted solder because the strongly oxidized oxide film having a low wettability with respect to solder is in contact with the soldering-target region. In addition, even if the amount of solder overflow is too large to return the solder to the soldering-target region, the weakly oxidized oxide film is located next to the strongly oxidized one, and therefore the solder overflow wets the weakly oxidized film slightly and stays on the film. Further, when a strongly oxidized oxide film is provided in a boundary with a region to stick, e.g. a resin housing to be provided in another step, it becomes more difficult for the solder overflow to cross over the oxide film.

This can also apply to the other examples below. In the example shown in FIG. 2B the oxide film 8 is formed in straight line shapes. However, the straight line-shaped oxide film segments are spaced apart from one another unlike the example shown in FIG. 1A. While the wettability of the oxide film 8 with respect to solder is worse in comparison to nickel, the oxide film 8 does not repel solder without being wetted like the solder resist 10. Hence, the solder having run over the soldering-target region stays on the first oxide film. Even if the solder runs over the first oxide film, it will be stopped on the subsequent oxide film. Therefore, even when a whole targeted surface portion of the first member is not covered with the oxide film, solder can be kept within the soldering-target region. As the patterns of the oxide film are drawn so that they are spaced apart from one another, the time required for the step of forming an oxide film can be made shorter in comparison to the case of forming the oxide film on a whole targeted surface portion as shown in FIG. 2A.

Figure 2C:
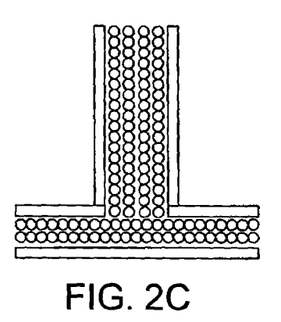
Figure 2D:
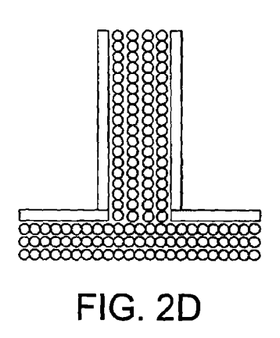
Figure 2E:
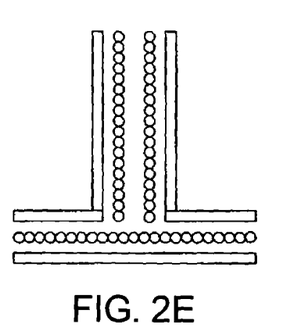
Figure 2F:
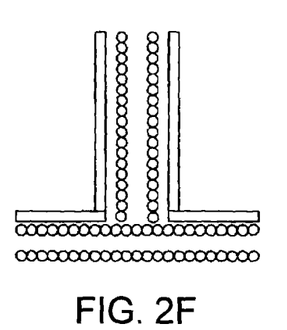
Figure 2G:
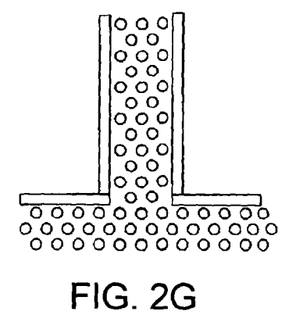
Figure 2H:
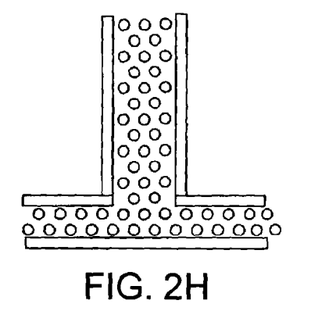

In the examples shown in FIGS. 2C, 2E and 2H, straight line-shaped oxide film segments are provided on outer peripheral portions of a region on which to form the oxide film 8, and dot-like oxide film segments are formed on an area inside the outer peripheral portions. The action to stop the solder having run over the soldering-target region is the same as that in the case shown FIG. 2B. As already described, the speed of forming an oxide film in the case of forming a dot-like oxide film segment is faster than that in the case of forming a line-shaped oxide film segment. Therefore, the step of forming an oxide film can be made shorter. In this case, the straight line-shaped oxide film segments surrounding the dot-like oxide film segments may be strongly oxidized.

In the cases of FIGS. 2C and 2E, the dot-like oxide film segments are arrayed in a straight line, whereas in the case of FIG. 2H, the dot-like oxide film segments are spaced apart from one another and arranged in zigzag. Even when dot-like oxide film segments are spaced apart from one another as shown in FIG. 2H, the oxide film can stop a drop of solder.

To form dot-like oxide film segments spaced apart from one another and arranged in zigzag as in the cases of FIGS. 2G and 2H, it suffices to slightly shift the location for starting laser light irradiation.

Figure 3:
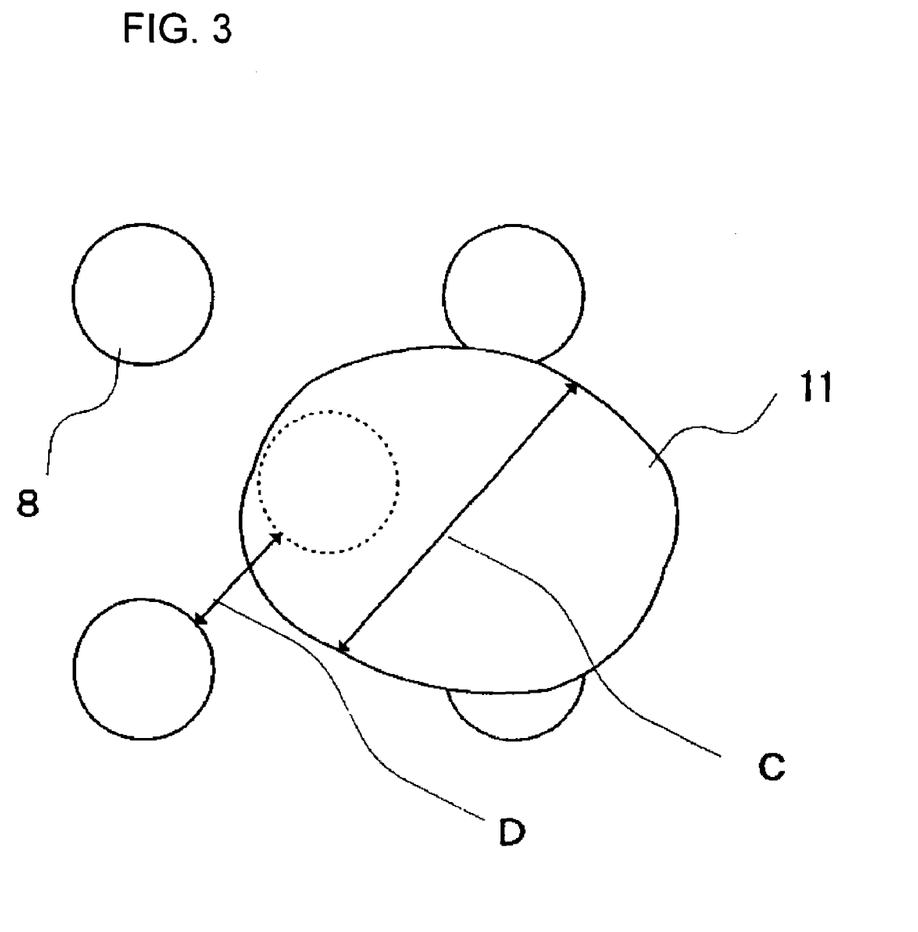
FIG. 3 is an illustration showing dot-like oxide film segments and a drop of solder.

FIG. 3 is an illustration showing dot-like segments of the oxide film 8 and a drop of solder 11. As shown in the drawing, the space between dot-like oxide film segments may be any size as long as a drop of solder having overflowed from the soldering-target region A onto the cooling base plate 1 can be prevented from flowing outside of a soldering-target region. For instance, the space may be a size as large as the size C (100 μm) of a drop of solder having flowed over the soldering-target region, or a smaller size D (about 50 μm).

The examples of FIGS. 2D, 2F and 2G are similar to the examples of FIGS. 2C, 2E and 2H, except that no straight line-shaped oxide film segment is formed in a farthermost location from each soldering-target region. This is because even when a drop of solder flows over from the soldering-target region A onto the cooling base plate 1, the oxide film neighboring the soldering-target region A, a straight line-shaped oxide film segment, and a dot-like oxide film segment, which are formed next to the neighboring oxide film, prevent the solder from further flowing out. When the formation of the oxide film of a straight line form in a farthermost location from the soldering-target region is omitted, the time required for the step of forming the oxide film can be shortened further.

First Embodiment

Figure 4:
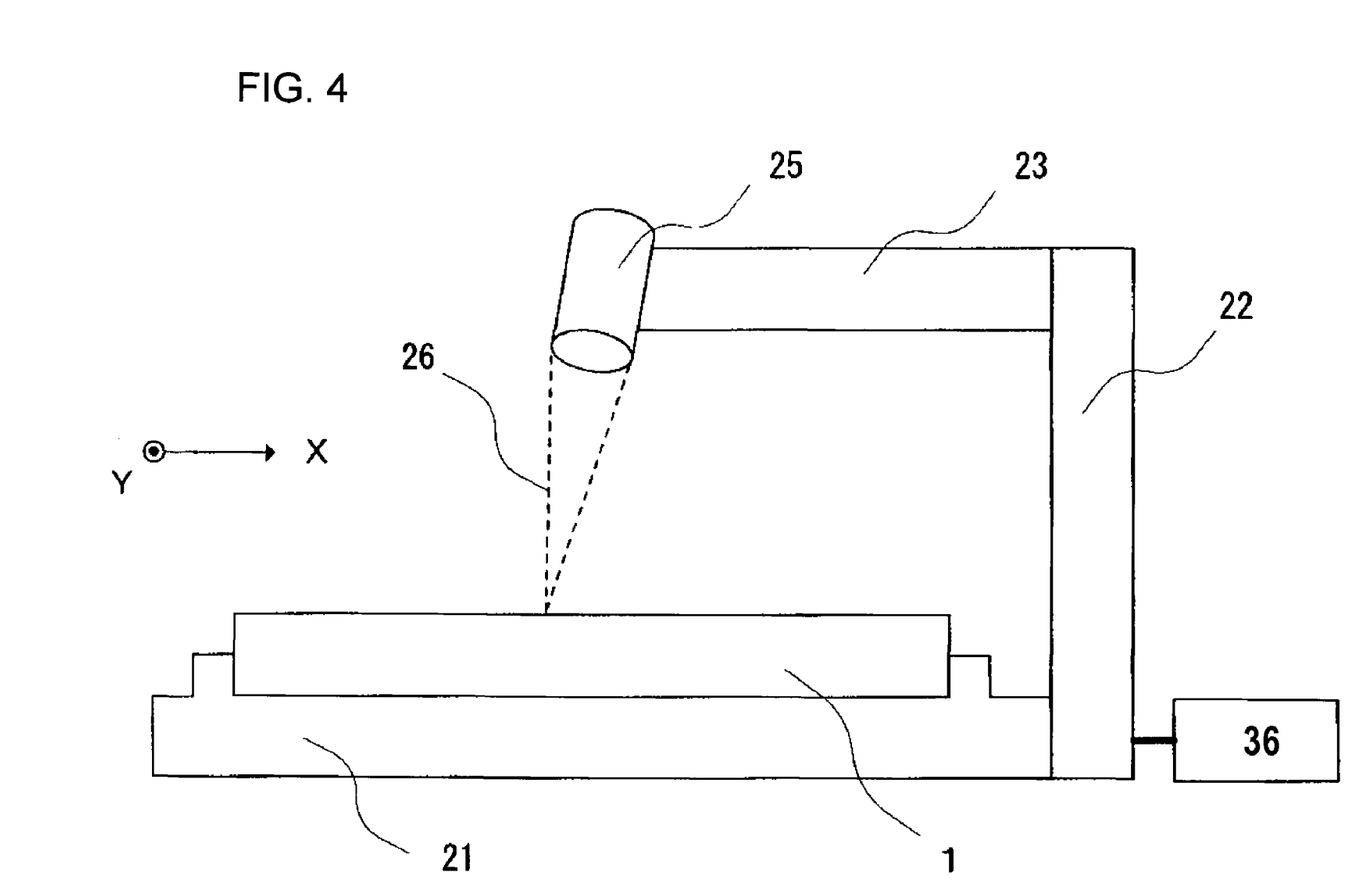
FIG. 4 is an illustration showing an example of a device for forming an oxide film on the cooling base plate according to the first embodiment.

FIG. 4 shows an example of a device for forming an oxide film on the cooling base plate according to the first embodiment. In the drawing, the reference numeral 21 denotes a stage on which to put the cooling base plate 1; the numeral 22 denotes a support pole for supporting a laser-shooting unit 25; the numeral 23 denotes an arm; and the numeral 36 denotes a control device. The laser-shooting unit 25 serves to irradiate the cooling base plate 1 with the laser light 26 thereby to form an oxide film on a surface of the cooling base plate 1.

To form an oxide film of a desired shape on the cooling base plate 1, a spot targeted for irradiation with laser light may be moved as described above. To move the spot targeted for irradiation with laser light, the optical system of the laser-shooting unit may be operated in X and Y directions. Alternatively, the support pole 22 and arm 23 may be moved with respect to the stage 21 in X and Y directions as shown in FIG. 4. Also, the stage 21 may be moved in X and Y directions as shown in FIG. 4.

The motion of the spot targeted for irradiation with laser light is controlled by the control device 36. Even in the cases of changing and newly preparing the oxide film pattern according to, e.g., the change in specifications, and model changeover of the semiconductor device using the cooling base plate, the shape of the oxide film can be varied only by changing the settings (a program) of the control device 36. Also, the location for starting laser light irradiation as described above can be changed by varying the settings of the control device 36.

The shape of the oxide film can be changed easily, and therefore the method according to the invention can flexibly cope with the case of preparing two or more kinds of cooling base plates in small lots.

Second Embodiment

Figure 5:
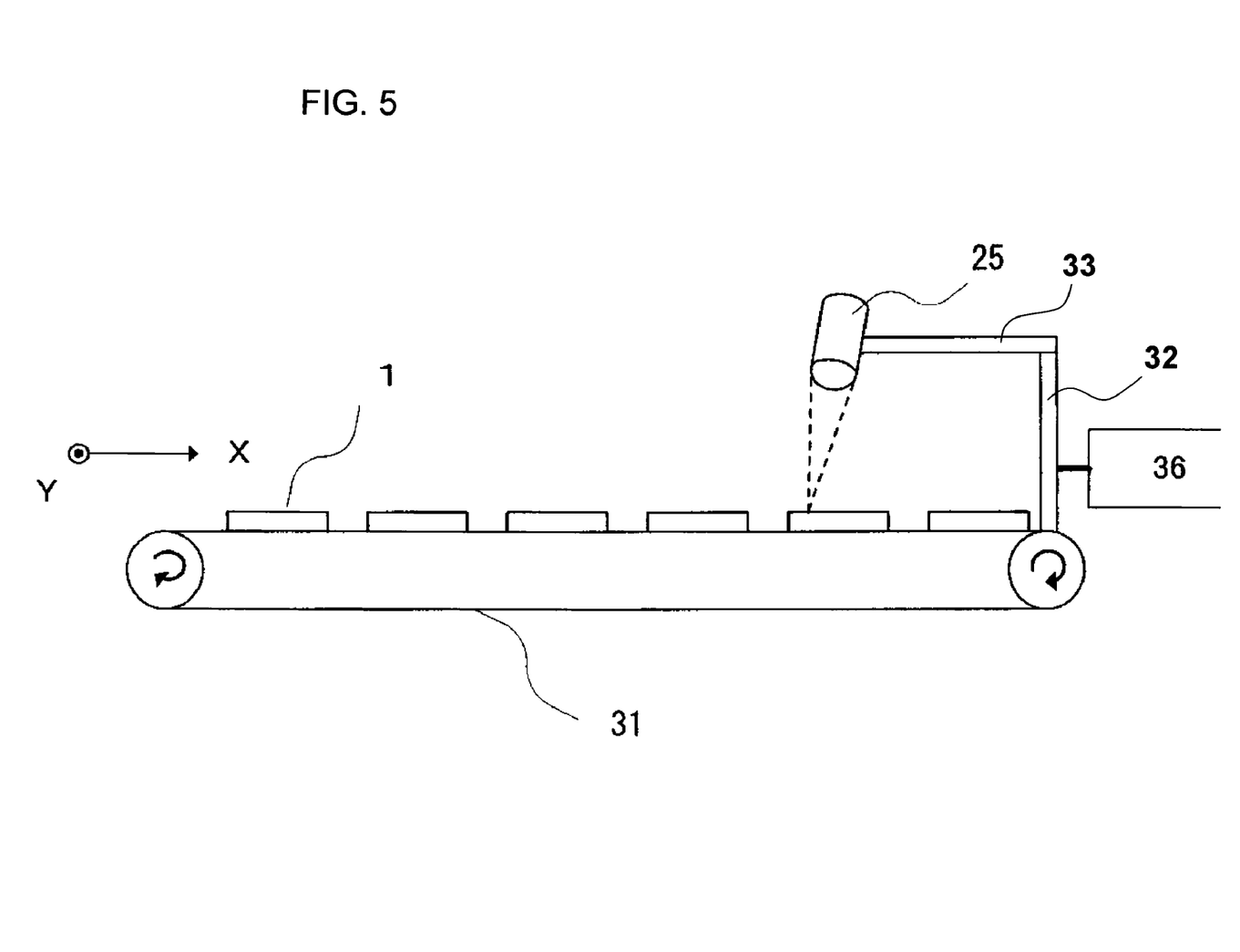
FIG. 5 is an illustration showing another example of the device for forming an oxide film on the cooling base plate according to the first embodiment.

FIG. 5 shows another example of the device for forming an oxide film on the cooling base plate according to the first embodiment. In the drawing, the reference numeral 31 denotes a belt for sequentially moving the cooling base plate 1 in a horizontal direction, on which the cooling base plate is put. The numerals 32 and 33 denote a support pole for supporting a laser-shooting unit 25 and an arm respectively, which function in the same ways as those shown in FIG. 4. Further, the numeral 36 denotes a control device.

An oxide film is formed on the cooling base plate 1 by laser light irradiation as in the case described with reference to FIG. 4. In this embodiment, as the cooling base plate is moved to a location underneath the laser-shooting unit 25 by the belt 31 sequentially, an oxide film can be formed on two or more cooling base plates 1 successively.

To form an oxide film of a desired shape on each cooling base plate 1, it suffices to move the spot targeted for irradiation with laser light as described above. To move the spot targeted for irradiation with laser light, it suffices to move the optical system of the laser-shooting unit in X and Y directions as shown in FIG. 5. Alternatively, the support pole 22 and arm 23 may be moved with respect to the belt 31 in X and Y directions as shown in FIG. 5. The belt 31 transports the cooling base plate to a given location and then stops it. Also, the belt 31 conveys the cooling base plate to a location for a subsequent step after the completion of the step of forming an oxide film. The driving of the belt and shooting of the laser light are interlocked with each other and controlled by a control device 36. Laser light may be shot to the cooling base plate while moving the cooling base plate.

The motion of a spot targeted for irradiation with laser light is controlled by the control device 36. Even in the cases of changing and newly preparing the oxide film pattern according to, e.g., the change in specifications, and model changeover of the semiconductor device using the cooling base plate, the shape of the oxide film can be varied only by changing the settings of the control device.

The shape of the oxide film can be changed easily, and therefore the method according to the invention can flexibly cope with the case of preparing two or more kinds of cooling base plates in small lots.

Figure 6A:
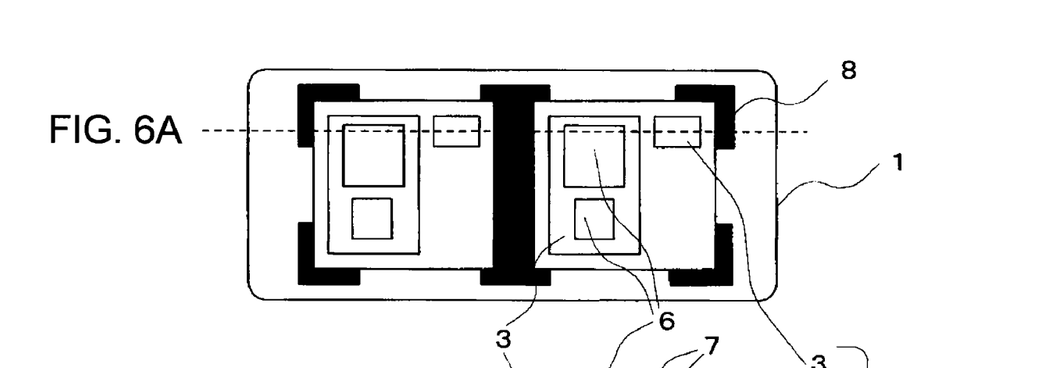
FIGS. 6A and 6B are illustrations showing the second embodiment.
Figure 6B:
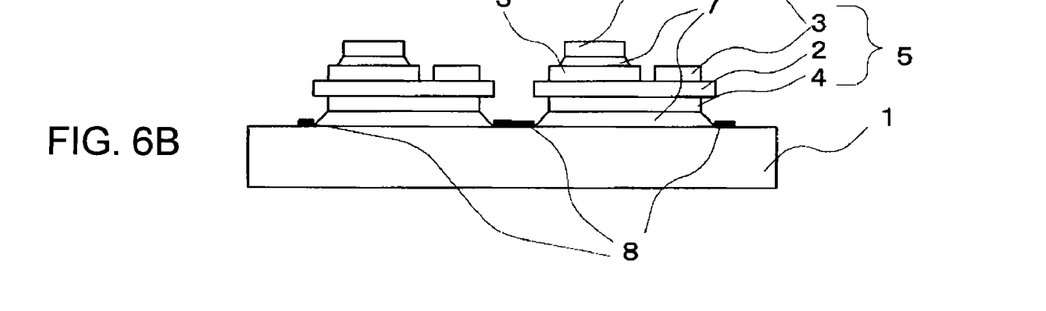

FIGS. 6A and 6B are illustrations showing a semiconductor device according to the second embodiment of the invention. The same constituents as those shown in FIGS. 7A and 7B are identified by the same reference numeral or character, and the descriptions are therefore are omitted here.

Specifically, FIGS. 6A and 6B show an important portion of the semiconductor device. Of the drawings, FIG. 6A is a top view of the important portion, and FIG. 6B is a sectional view taken along the broken line shown in FIG. 6A. In the drawing, the reference numeral 1 denotes a cooling base plate, which is a first member. Herein, a copper plate is adopted as the cooling base plate, which is plated with nickel because of the wettability with respect to solder and the aim of preventing the natural oxidation of a surface thereof. The numeral 2 denotes a ceramic plate, and the numeral 3 denotes a copper pattern formed on a front face of the ceramic plate, the numeral 4 denotes a copper pattern formed on a rear face of the ceramic plate. The ceramic plate 2 and copper patterns 3 and 4 constitute an insulating board 5. The insulating board 5 represents the second member.

To prevent the solder 7 from running over a given soldering region during soldering, an oxide film 8 is formed on an outer peripheral portion surrounding the soldering region on the surface of the cooling base 1. The oxide film 8 is the one which has been described above in the description on the first embodiment.

The oxide film 8 does not surround the outer periphery of the insulating board 5 completely as in FIG. 6A. This is because the insulating board 5 can be prevented from being displaced as the solder 7 is melted and positioned in place as long as each corner portion of the insulating board 5 is surrounded by the oxide film 8. Further, a portion between two insulating boards 5 is covered with the oxide film 8. The reason for this is because adhesion of solder to this portion deteriorates the withstand voltage between the insulating boards 5, and therefore a measure to prevent deterioration in the withstand voltage is taken.

Now, a method of manufacturing a semiconductor device incorporating a cooling base plate as described above will be described. First, an oxide film 8 is formed on a cooling base plate 1 as described above. Second, a solder paste is applied to a soldering-target region or a solder sheet is put thereon. Further, an insulating board 5 is put on the solder paste or solder sheet. Now, it is noted that in the case where the solder for bonding a semiconductor element 6 with a copper pattern 3 on the insulating board 5 is identical in melting point with the solder for bonding the cooling base plate 1 with the insulating board 5, the semiconductor element 6 is put on the copper pattern 3 through solder (in paste or sheet).

Next, the resultant laminate is loaded into a furnace under an atmosphere having no reducing property and heated thereby to melt the solder. The reason why the inside of the furnace is kept in the atmosphere having no reducing property is to suppress the reducing action. This is because in an atmosphere having a strong reducing property, such as an atmosphere of hydrogen, an oxide film is reduced and then made smaller in thickness, or faded away, and thus it becomes difficult to suppress runoff of the solder. Examples of the atmosphere having no reducing property include an atmosphere of nitrogen and the Earth's atmosphere.

The resultant laminate is removed from the furnace after the solder is melted, and then cooled thereby to harden the solder. Thus, the bond of the cooling base plate 1 with the copper pattern 4 on the rear face of the insulating board and the bond of the semiconductor element 6 with the copper pattern 3 on the front face of the insulating board are completed.

Subsequently, a resin housing (not shown) is stuck to the cooling base plate 1, and a given connection is made by wire bonding, etc. As the above-described oxide film enables the suppression of the runover of solder into a region to stick the resin housing of the cooling base plate on, nothing interferes with the step of sticking.

Incidentally, the copper pattern 3 on the front face of the insulating board may be made the first member, and the semiconductor element may be handled as the second member. In this situation, an oxide film may be formed on at least one part of an outer peripheral portion surrounding a soldering-target region of the copper pattern 3.

The invention has been described with reference to certain preferred embodiments thereof. It will be understood that modifications and variations are possible within the scope of the appended claims.

This application is based on, and claims priority to, Japanese Patent Application No: 2007-045339, filed on Feb. 26, 2007. The disclosure of the priority application, in its entirety, including the drawings, claims, and the specification thereof, is incorporated herein by reference.

What is claimed is:

1. A soldering method of soldering a cooling base member made of a first metal material to a second member, the method comprising the steps of:

forming a solder resist region composed of an oxide film of the first metal material of the cooling base member at at least one part of an outer peripheral portion surrounding a soldering-target region of the cooling base member by selectively shooting a laser light to the at least one part of the outer peripheral portion surrounding the soldering-target region of the cooling base member to thermally oxidize a surface of the cooling base member and form the oxide film of the first metal material; and bonding the second member to the soldering-target region of the cooling base member using a solder, wherein the oxide film has a strongly oxidized region and a weakly oxidized region, wherein the strongly oxidized region is positioned bordering the soldering-target region so that the strongly oxidized region is in contact with the soldering-target region.

2. The soldering method according to claim 1, wherein the laser light is a pulsed laser light.

3. The soldering method according to claim 2, wherein the oxide film of the first metal material is formed in at least one of a line-shaped form or a dot-like form by shooting the pulsed laser light to the cooling base member while moving a shooting point of the pulsed laser light.

4. The soldering method according to claim 3, wherein the oxide film of the first metal material in the line-shaped form or the dot-like form is formed on at least two locations at intervals to prevent the solder from flowing beyond the soldering-target region of the cooling base member in the bonding step.

5. The soldering method according to claim 1, wherein the bonding step is executed in an atmosphere having no reducing property.

6. The soldering method according to claim 1, wherein the second member is an insulating board.

7. The soldering method according to claim 1, wherein the cooling base member has a plating of a second metal material over the first metal material.

8. The soldering method according to claim 7, wherein the first metal material is copper and the second metal material is nickel.

9. The soldering method according to claim 8, wherein the oxide film of copper is formed adjacent to the soldering-target region region of the cooling base member.

10. The soldering method according to claim 1, wherein the laser light is shot only at the at least one part.

11. A method of manufacturing a semiconductor device having a cooling base member made of a first metal material and an insulating board soldered to the cooling base member, the method comprising the steps of:

forming a solder resist region composed of an oxide film of the first metal material at least one part of an outer peripheral portion surrounding a soldering-target region of the cooling base member by selectively shooting a laser light to the at least one part of the outer peripheral portion surrounding the soldering-target region of the cooling base member to thermally oxidize a surface of the cooling base member and form the oxide film of the first metal material; and soldering the insulating board to the soldering-target region of the cooling base member, wherein the oxide film has a strongly oxidized region and a weakly oxidized region, and wherein the strongly oxidized region is positioned bordering the soldering-target region so that the strongly oxidized region is in contact with the soldering-target region.

12. The method of manufacturing a semiconductor device according to claim 11, wherein the solder resist region is formed to cover a corner portion of the insulating board.

13. The method of manufacturing a semiconductor device according to claim 11, wherein the solder resist region is formed to partially cover a side of the insulating board.

14. The method of manufacturing a semiconductor device according to claim 11, wherein when at least another insulating board identical to the insulating board is arranged, the solder resist region is formed to cover opposing sides of the insulating boards.

15. The method of manufacturing a semiconductor device according to claim 11, wherein the cooling base member has a plating of a second metal material over the first metal material.

16. The method of manufacturing a semiconductor device according to claim 15, wherein the first metal material is copper and the second metal material is nickel.

17. The method of manufacturing a semiconductor device according to claim 16, wherein the oxide film of nickel is formed adjacent to the soldering-target region of the cooling base member.

18. The method of manufacturing a semiconductor device according to claim 11, wherein the oxide film of the first metal material is formed in at least one of a line-shaped form or a dot-like form by shooting a pulsed laser light to the cooling base member while moving a shooting point of the pulsed laser light.

19. The method of manufacturing a semiconductor device according to claim 18, wherein the oxide film of the first metal material in the line-shaped form or the dot-like form is formed on at least two locations at intervals to prevent the solder from flowing beyond the soldering-target region of the cooling base member in the bonding step.

20. A soldering method of soldering a cooling base member, which is made of copper and a nickel plating over the copper, to a second member, the method comprising the steps of:

forming a solder resist region composed of an oxide film of nickel at at least one part of an outer peripheral portion surrounding a soldering-target region of the cooling base member by selectively shooting a laser light to the at least one part of the outer peripheral portion surrounding the soldering-target region of the cooling base member to thermally oxidize a surface of the cooling base member and form the oxide film of nickel; and bonding the second member to the soldering-target region of the cooling base member using a solder, wherein the oxide film of nickel is formed by shooting the laser light to the surface of the cooling base member with energy sufficient only to oxidize the nickel plating without oxidizing the copper therebelow.

21. The method of manufacturing a semiconductor device according to claim 16, wherein the oxide film is an oxide film of nickel formed by shooting the laser light to the surface of the cooling base member with energy sufficient only to oxidize the nickel plating without oxidizing the copper therebelow.

* * * * *